United States Patent [19]

Rosan

[11] Patent Number: 5,212,377
[45] Date of Patent: May 18, 1993

[54] THIN-FILM NEURON NETWORK WITH OPTICAL PROGRAMMING

[75] Inventor: Karlheinz Rosan, München, Fed. Rep. of Germany

[73] Assignee: Siemens Aktiengesellschaft, Munich, Fed. Rep. of Germany

[21] Appl. No.: 838,241
[22] PCT Filed: Jan. 16, 1990
[86] PCT No.: PCT/DE90/00021
    § 371 Date: Feb. 28, 1992
    § 102(e) Date: Feb. 28, 1992
[87] PCT Pub. No.: WO91/03798
    PCT Pub. Date: Mar. 21, 1991

[30] Foreign Application Priority Data

Sep. 1, 1989 [DE] Fed. Rep. of Germany ....... 3929132

[51] Int. Cl.$^5$ .............................................. H01J 31/50
[52] U.S. Cl. ........................................ 250/214; 395/25
[58] Field of Search ............. 250/213 A, 201.9, 208.1; 364/822, 807; 395/25; 307/201, 464, 529

[56] References Cited

U.S. PATENT DOCUMENTS 4,809,193 2/1989 Jourjine .................................. 395/25
4,985,621 1/1991 Aull ........................................ 395/25

FOREIGN PATENT DOCUMENTS

WO86/01931 3/1986 PCT Int'l Appl. .

OTHER PUBLICATIONS

"Artificial Neural Networks", J. J. Hopfield, IEEE Circuits & Devices Magazine, Sep. 1988, pp. 3–10.
"Design and Elektronik", issue 20 of Sep. 27, 1988, pp. 94, 96, 100–102, 109–117.
"An Optically Programmed Neural Network", by C. D. Kornfeld et al., IEEE International Conference on Neural Networks, San Diego, Calif., Jul. 24–27, 1988, pp. 357–364.

Primary Examiner—David C. Nelms
Assistant Examiner—K. Shami
Attorney, Agent, or Firm—Hill, Steadman & Simpson

[57] ABSTRACT

A synapse matrix and a device for optical programming are contained integrated in thin-film technology in a common substrate (1). The synapses consist of photoelectric elements. The device for optical programming consists, for example, of a liquid crystal screen or an arrangement of electroluminescent diodes. It is within the scope of the invention that neurons in thin-film technology, contained in the neuron network, are also integrated on the substrate. The neuron network can be used especially for pattern recognition.

9 Claims, 2 Drawing Sheets

THIN-FILM NEURON NETWORK WITH OPTICAL PROGRAMMING

BACKGROUND OF THE INVENTION

The invention relates to a thin-film neuron network with optical programming.

Conventional von-Neumann computing machines operate in accordance with a mathematical rule which is predetermined with the aid of a program. The prerequisite for solving a problem with a von-Neumann computer is therefore that the approach to the solution is known in principle. This is because it is only for an approach known in principle that an algorithm can be set up which is converted to a program.

There are a number of problems for which it is not possible to specify a precise approach in principle to a solution. For example, when comparing a signature with a stored signature sample, a correspondence must be detected even if the two signatures differ slightly. A von-Neumann computer with conventional programming reaches the limits of its capability with such problems of recognizing incomplete patterns.

By contrast, problems of this type can be solved by using neuron networks, also called neurocomputing. Neuron networks function in accordance with the same principle as the human brain. A neuron network consists of a multiplicity of neurons which in each case have many inputs and one output. The neurons are connected to one another via links of different strength which are called synapses. In the neuron, the weighted sum of all inputs is then formed. From this weighted sum, an output signal is generated via an evaluator which is a component of the neuron. The weighting of the individual inputs occurs via the synapses, the links of different strengths. In the evaluator, the sum is evaluated in accordance with a predetermined function. Functions considered are, for example, step functions, threshold functions or the sigmoid function. Neuron networks are described, for example, in J. J. Hopfield, IEEE Circuits and Devices Magazine, September 1988, pages 3–10, and Design and Elektronik, issue 20 of Sep. 27, 1988, pages 94, 96, 100–102, 104, 109–117.

The information in a neuron network is stored in the strength of the synapses. The strength of the synapses is initially defined with the aid of problem examples having a known solution which run in the neuron network. During the operation of a neuron network, the synapses are adapted with the aid of solutions found for problems processed. This process corresponds to the storing of experience in the human brain. That is to say a neuron network "is continuously learning more".

For a neuron network to have approximately the capacity of the human brain, the corresponding number of neurons must be implemented. The surface of the human brain amounts to about half a square meter in area. This large area required for an efficient neuron network is the reason for the hardware implementation still being in its infancy even though a high-performance and mature technology can be seen, for example, in microelectronics. This is why neuron networks have previously been mainly simulated on computers.

A main problem in the hardware implementation consists of the representation of the synapses. In principle, programmable resistances which are of simple construction and absorb little power are needed for the synapses since they are needed in a very great number.

The hardware implementation of a neuron network in amorphous hydrogen-containing silicon (a-Si:H) appears to be promising since amorphous hydrogen-containing silicon offers a number of characteristics which are particularly advantageous for implementing neuron networks. Essentially, the maximum size of a layer area in a-Si:H technology only depends on the size of the reactor used for producing the a-Si:H layers. It is therefore quite conceivable to create half a square meter of area corresponding to the surface of the human brain. The components needed for a neuron network such as resistors, diodes, transistors are of simple construction in this technology and therefore only require a small number of process steps. This is essential for the yield in the production of large, high-performance networks. In addition, the components in a-Si:H technology are high-impedance components and consume correspondingly little power. The ON resistance of thin-film transistors, for example, is in the megohm range.

The a-Si:H technology is a thin-film technology. By their nature, thin-film technologies are multi-layer technologies. It is therefore possible to implement a plurality of active layers and wiring planes.

The a-Si:H technology is fully compatible with the technology used in microelectronics for producing integrated circuits. This makes it possible to build up sections of a neuron network in amorphous, hydrogen-containing silicon, for example on a crystalline memory chip.

Due to their characteristics, photoelectric elements which can be produced in thin-film technology are suitable as synapses. Photoelectric elements have different resistances with different illumination. The electrical resistance of a photoelectric element can be continuously adjusted by appropriate illumination. Photoelectric elements can be uniformly produced in large numbers.

Using a photoelectric element arrangement as a synapse matrix is known, for example, from C. D. Kornfeld et al., IEEE International Conference on Neural Networks, San Diego, Calif. (1988) pages II-357–II-364. Photoelectric elements are built up in rows and columns, via which elements neurons constructed in conventional electronics and connected to the respective row and column ends are connected. The synapses formed from the photoelectric elements are programmed optically. The synapse matrix is illuminated via a pinhole diaphragm mask or a type of transparency or by a video projector. During the operation of the neuron network, the illumination represents the program in which the information is stored in the form of links of different strength.

The optical programming of synapse matrices of photoelectric elements has the disadvantage that, due to the variety of imaging errors and the required mechanical structure, tolerances occur in the optical imaging. When a video projector is used for illumination, for example, neither the brightness nor the image geometry are really stable. Moreover, the image quality itself leaves something to be desired. When a pinhole diaphragm mask or a transparency is used for illumination, the possibilities for changing the illumination corresponding to the adaptation of link strengths during the learning process are very restricted. Furthermore, a stable mechanical structure in the form of an optical bench is required.

SUMMARY OF THE INVENTION

The invention is based on the object of specifying a neuron network with optical programming in which the tolerances due to imaging and illumination errors are suppressed and in which an adaptation to changed link strengths is ensured.

According to the invention, the object is achieved by a neuron network with optical programming having the following features:

a) a substrate is provided which contains integrated a synapse matrix and a device for optical programming, b) the device for optical programming consists of photoelectric elements which an be triggered individually and are permanently assigned to respective synapses, c) the synapses consist of photoelectric elements which can be individually illuminated with the aid of the respective device for optical programming, d) the synapses have different electrical resistances which can be continuously adjusted by illumination with the aid of the device for optical programming, e) neutrons which are connected to one another via synapses are provided, f) at least the synapse matrix and the device for optical programming are implemented in thin-film technology.

By integrating the device for optical programming on one substrate with the synapse matrix consisting of photoelectric elements, the neuron network according to the invention exhibits good optical programming stability. Imaging errors are minimized by the fixed arrangement. When the neurons are also contained integrated on the substrate, the neuron network can be easily produced. There is no elaborate bonding to the synapse matrix of neurons produced in a different technology.

According to the invention, a light modulator is used as the device for optical programming. It is within the scope of the invention to use an arrangement with a liquid crystal in the manner of a liquid crystal screen as light modulator. Conventional liquid crystal screens use liquid crystals with helix structure. This type of display is known by the name of twisted nematic (TN) cell. The possibilities for multiplex operation of such a liquid crystal matrix are limited which is why more sophisticated liquid crystal screens contain an active matrix drive system of thin-film transistors of amorphous, hydrogen-containing silicon. Since, moreover, liquid crystal screens can be produced as flat screens, the integration on a common substrate with the synapse matrix consisting of photoelectric elements becomes possible. The link strengths of the synapses can be adapted via the active matrix drive system in accordance with the learning processes during the operation of the neuron network.

Because of their storage characteristics and very short switching times, the use of ferroelectric liquid crystals, which are currently being developed, is particularly advantageous.

Other physical effects for light modulation, such as, for example, the electro-optical Kerr effect, can be analogously utilized.

A further embodiment of the invention consists in providing a light source arrangement as the device for optical programming. In this connection, it is within the scope of the invention to use electroluminescent elements, which are driven by thin-film transistors, as light sources.

The neuron network can be used as memory if a mask with a fixed pattern is arranged between the synapse matrix and the device for optical programming.

Further developments of the invention are as follows. In an embodiment of the present invention the neuron network has the following features:

a) a first electrode structure is arranged on a substrate, b) the first electrode structure is covered with a photoconductive layer, c) a transparent electrically conductive layer is arranged on the photoconductive layer, d) a first polarizer layer is arranged on the transparent electrically conductive layer, e) a first polyimide layer is arranged on the first polarizer layer, f) a liquid crystal layer is arranged on the first polyimide layer, g) a second polyimide layer is arranged on the liquid crystal layer, h) a second electrode structure of transparent electrically conductive material is arranged on the second polyimide layer, i) a glass layer is arranged on the second electrode structure, j) a second polarizer layer is arranged on the glass layer, and k) the first electrode structure and the second electrode structure are coincident with one another at least in the area of the synapse matrix and are correspondingly arranged above one another.

The substrate can consists of glass, the first electrode structure of chromium or titanium, the photoconductive layer of amorphous, hydrogen-containing silicon, the transparent, electrically conductive layer of indium tin oxide, the first polarizer layer of a dielectric polarizer, the liquid crystal layer of a twisted or supertwisted nematic or of a ferroelectric liquid crystal, the second electrode structure of indium tin oxide and the second polarizer layer of plastic foil. A light source arrangement can be provided as the device for optical programming, or an electroluminescent diode arrangement can be provided as the device for optical programming, the electroluminescent diodes being driven by thin-film transistors integrated in the substrate. A mask with a fixed pattern is provided which is arranged between the synapse matrix and the device for optical programming.

The neuron network according to the invention has the advantage that imaging optics and associated imaging errors and the mechanical components required for this can be omitted. There is a strict geometric correlation between the device for optical programming and the photoelectric element. This is defined during the production process. This is why there are no calibration and decalibration problems and associated problems due to mechanical vibration, heating and the like.

The concept for the neuron network according to the invention is based on image sensor and screen knowhow already acquired. It is therefore not unrealistic to assume that networks with up to $10^5$ connections can be produced even with laboratory means.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawing, and in which:

BRIEF DESCRIPTION OF THE PREFERRED EMBODIMENT

Figure 1:
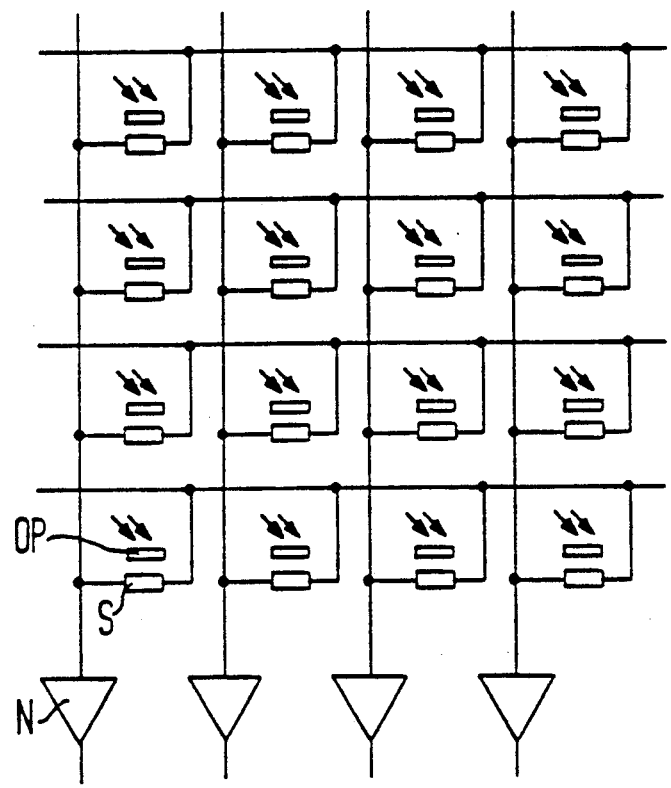
FIG. 1 shows an equivalent circuit for a neuron network with optical programming.

FIG. 1 shows a section from a neuron network which shows the principle of optical programming. The section contains synapses S which are arranged in the form of a matrix, and neurons N which are in each case connected to one column of the matrix. The synapses consist of photoelectric elements which can be illuminated via devices for optical programming OP. In this arrangement, each synapse S can be individually illuminated. The synapses S have different electrical resistances or, respectively, a current of different magnitude flows through them in accordance with the illumination. Light modulators or light source arrangements, for example, are suitable as device for optical programming OP. Arrangements using liquid crystals in the manner of a liquid crystal screen, for example, or arrangements which utilize the electro-optical Kerreffect, for example, are suitable for light modulation. Electroluminescent elements driven by thin-film transistors, for example, are suitable as light source arrangements.

Figure 2:
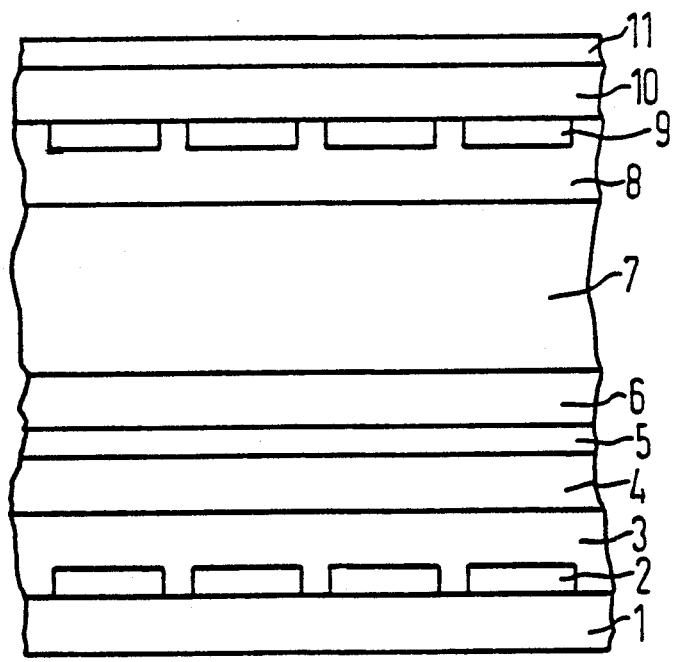
FIG. 2 shows a cross section through a neuron network according to the invention, with integrated optical programming.

FIG. 2 shows a substrate 1 of, for example, glass. On the substrate 1, a first electrode structure 2 is arranged. The first electrode structure 2 consists, for example, of chromium or titanium. The first electrode structure 2 is covered with a photoconductive layer 3. The photoconductive layer 3 consists, for example, of amorphous, hydrogen-containing silicon and has a thickness of about 1 $\mu$m. A transparent, electrically conductive layer 4 is arranged on the photoconductive layer 3. The transparent, electrically conductive layer 4 consists, for example, of indium tin oxide and has a thickness of about 100 nm. The substrate 1, the first electrode structure 2, the photoconductive layer 3 and the transparent electrically conductive layer 4 form a synapse matrix, the synapses being formed by photoelectric elements. The extent of the area of each photoelectric element is defined by the first electrode structure 2.

On the transparent electrically conductive layer 4, a first polarizer layer 5 is arranged. The first polarizer layer consists, for example, of a dielectric polarizer and has a thickness of about 100 nm. A first polyimide layer 6 with a thickness of about 100 nm is arranged on the first polarizer layer 5. A liquid crystal 7 is arranged on the first polyimide layer 6. The following materials, for example, are suitable as liquid crystal 7: twisted or super-twisted nematic liquid crystals. If a liquid crystal material is used for a scattering cell, polarizers are not needed. The liquid crystal 7 typically has a thickness of 5 $\mu$m-10 $\mu$m. A second polyimide layer B of a thickness of about 100 nm is arranged on the liquid crystal 7. A second electrode structure 9 is arranged on the second polyimide layer 8. The second electrode structure 9 consists of transparent electrically conductive material, for example an indium tin oxide (ITO). The first electrode structure 2 and the second electrode structure 9 are arranged coincident with one another and correspondingly above one another at least in the area of the synapse matrix. The second electrode structure 9 is used for aligning the liquid crystals in the liquid crystal 7. The first electrode structure 2 defines the areas of the individual photoelectric elements. On the second electrode structure 9, a glass layer 10 is arranged in a thickness of about 1 mm. A second polarizer layer 11 which, for example, consists of a plastic foil and has a thickness of about 0.5 mm, is arranged on the glass layer 10.

The first polarizer layer 5, the first polyimide layer 6, the liquid crystal 7, the second polyimide layer 8, the second electrode structure 9, the glass layer 10 and the second polarizer layer 11 form a liquid crystal screen. The liquid crystal screen is used for light modulation in the illumination of the synapse matrix. In this arrangement, light is radiated into the arrangement from the second polarizer layer 11. The second electrode structure 9 is used for aligning the liquid crystal elements of the liquid crystal 7. Since the second electrode structure 9 is arranged to be coincident above the first electrode structure 2, the liquid crystal elements above a photoelectric element are jointly aligned. This arrangement of the first electrode structure 2 and the second electrode structure 9 therefore ensures that the illumination of each photoelectric element is individually light-modulated.

Figure 3:
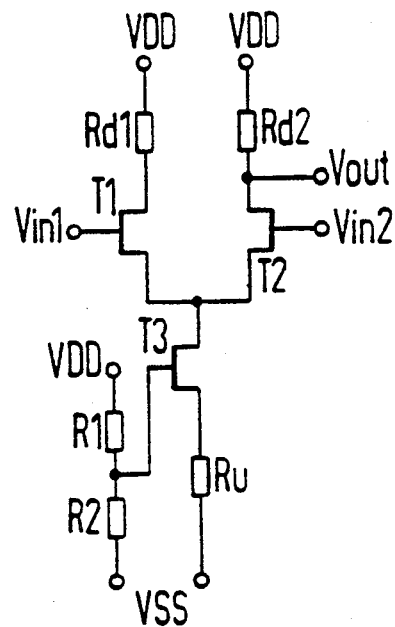
FIG. 3 shows a circuit for a neuron.

FIG. 3 shows a circuit for a neuron which generates an output signal Vout as a function of two input signals Vin1 and Vin2. In the circuit, a first transistor T1 is provided at the control terminal of which the first input signal Vin1 is present. A first terminal of the first transistor T1 is connected via a first resistor Rd1 to a first supply voltage VDD. A second transistor T2 is provided at the control electrode of which the second input signal Vin2 is present. A first terminal of the second transistor T2 is connected via a second resistor Rd2 to the first supply voltage VDD. The output signal Vout is picked up at the first terminal of the second transistor T2. A second terminal of the first transistor and a second terminal of the second transistor T2 are connected to one another and to a first terminal of a third transistor T3. The control electrode of the third transistor T3 is connected via a third resistor R1 to the first supply voltage VDD. The control electrode of the third transistor T3 is also connected via a fourth resistor R2 to a second supply voltage VSS. A second terminal of the third transistor T3 is connected via a fifth resistor RU to the second supply voltage VSS.

The circuit causes the input signals Vin1 and Vin2 to be subtracted from one another. It generates the output signal Vout in accordance with a threshold-value logic.

Figure 4:
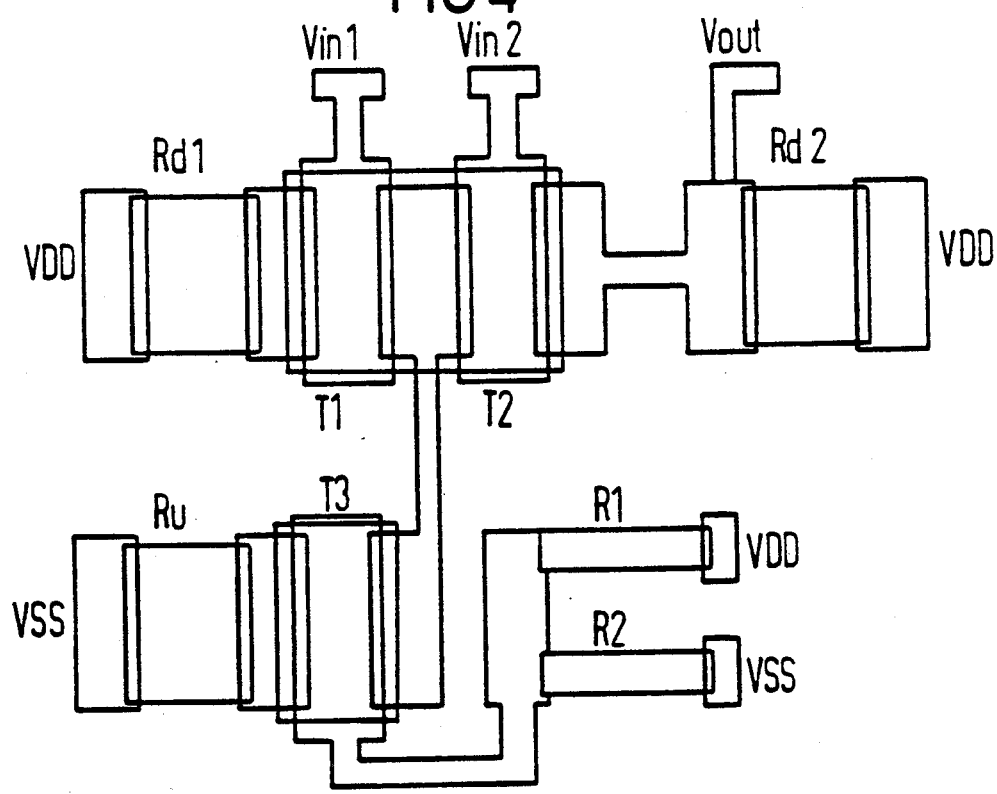
FIG. 4 shows the diagrammatic structure in thin-film technology for a neuron according to the circuit shown in FIG. 3.

FIG. 4 diagrammatically shows an implementation of the circuit shown in FIG. 3 in thin-film technology. Neurons according to this circuit are used in the neuron network according to the invention. In this arrangement, the input signals Vin1 and Vin2 are connected to rows of the synapse matrix. The output signal Vout is again connected to the synapse matrix.

In the neuron network according to the invention, both the synapse matrix and the device for optical programming and the neurons are integrated on one substrate. This is possible since all three components can be produced in the same technology.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A neuron network with optical programming, comprising:
   a) substrate having integrated thereon a synapse matrix and a means for optical programming,
   b) the means for optical programming having photoelectric elements which can be triggered individually and are permanently assigned to respective synapses,
   c) the synapses having photoelectric elements which can be individually illuminated by the means for optical programming,
   d) the synapses having different electrical resistances which can be substantially continuously adjusted by illumination by the means for optical programming,
   e) a plurality of neurons connected to one another via the synapses, and
   f) at least the synapse matrix and the means for optical programming being implemented in thin-film technology.

2. The neuron network as claimed in claim 1, wherein the neurons are integrated in the substrate in thin-film technology.

3. The neuron network as claimed in claim 1, wherein the means for optical programming is a light modulator.

4. The neuron network as claimed in claim 3, wherein the means for optical programming is an arrangement using liquid crystals in a liquid crystal screen.

5. The neuron network as claimed in claim 4, wherein:
   a) a first electrode structure is arranged on the substrate,
   b) the first electrode structure is covered with a photoconductive layer,
   c) a transparent electrically conductive layer is arranged on the photoconductive layer,
   d) a first polarizer layer is arranged on the transparent electrically conductive layer,
   e) a first polyimide layer is arranged on the first polarizer layer,
   f) a liquid crystal layer is arranged on the first polyimide layer,
   g) a second polyimide layer is arranged on the liquid crystal layer,
   h) a second electrode structure of transparent electrically conductive material is arranged on the second polyimide layer,
   i) a glass layer is arranged on the second electrode structure,
   j) a second polarizer layer is arranged on the glass layer, and
   k) the first electrode structure and the second electrode structure are coincident with one another at least in the area of the synapse matrix and are correspondingly arranged above one another.

6. The neuron network as claimed in claim 5, wherein the substrate consists of glass, the first electrode structure consists of one of chromium and titanium, the photoconductive layer consists of amorphous, hydrogen-containing silicon, the transparent, electrically conductive layer consists of indium tin oxide, the first polarizer layer consists of a dielectric polarizer, the liquid crystal layer consists of one of a twisted nematic or super-twisted nematic and a ferroelectric liquid crystal, the second electrode structure consists of indium tin oxide and the second polarizer layer consists of plastic foil.

7. The neuron network as claimed in claim 3, wherein said light modulator is a light source arrangement.

8. The neuron network as claimed in claim 7, wherein the light source arrangement is an electroluminescent diode arrangement having a plurality of electroluminescent diodes, the electroluminescent diodes being driven by thin-film transistors integrated in the substrate.

9. The neuron network as claimed in claim 1, wherein a mask with a fixed pattern is arranged between the synapse matrix and the means for optical programming.

* * * * *